(12) United States Patent
Park et al.

(10) Patent No.: US 7,373,582 B2
(45) Date of Patent: May 13, 2008

(54) APPARATUS AND METHOD FOR TURBO DECODING USING A VARIABLE WINDOW SIZE

(75) Inventors: Sung-Jin Park, Seoul (KR); Min-Goo Kim, Yongin-si (KR); Soon-Jae Choi, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 394 days.

(21) Appl. No.: 11/135,633

(22) Filed: May 24, 2005

(65) Prior Publication Data

US 2005/0273687 A1    Dec. 8, 2005

(30) Foreign Application Priority Data

May 24, 2004    (KR) .................. 10-2004-0036742

(51) Int. Cl.
    *H03M 13/03*    (2006.01)
(52) U.S. Cl. .............. 714/755; 714/789; 714/790; 714/794; 714/796
(58) Field of Classification Search ................ 714/755, 714/786, 789–796
    See application file for complete search history.

(56) References Cited

U.S. PATENT DOCUMENTS

| | | | | |
|---|---|---|---|---|
| 6,381,728 B1 * | 4/2002 | Kang | ................... | 714/781 |
| 6,563,877 B1 * | 5/2003 | Abbaszadeh | ................ | 375/242 |
| 6,813,743 B1 * | 11/2004 | Eidson | ................... | 714/795 |
| 6,829,313 B1 * | 12/2004 | Xu | ....................... | 375/341 |
| 7,058,874 B2 * | 6/2006 | Zhou | ........................ | 714/756 |
| 7,213,194 B2 * | 5/2007 | Nieminen | ................. | 714/794 |
| 2002/0174401 A1 * | 11/2002 | Wang et al. | .............. | 714/786 |

* cited by examiner

*Primary Examiner*—Guy Lamarre
*Assistant Examiner*—Esaw Abraham
(74) *Attorney, Agent, or Firm*—Roylance, Abrams, Berdo & Goodman, L.L.P.

(57) ABSTRACT

An apparatus and method for turbo decoding using a variable window size. A control logic block receives information about a code rate of received data bits and a data block size, adjusts a window size according to the code rate information, and computes an initial delay. Delta metric blocks compute delta metrics from input data bits of the block size, wherein the delta metrics represent a transition probability for a path from a state to another state, respectively. An alpha metric block receives a delta metric in synchronization with the initial delay, and computes an alpha metric representing a forward state transition probability in each state. One or more beta metric blocks receive delta metrics according to the adjusted window size, and compute beta metrics representing a backward state transition probability in each state, respectively. A log likelihood ratio (LLR) block receives the alpha metric and the beta metrics in synchronization with the initial delay, and computes LLR values for symbols in an ending state. Code reliability is maintained by using a sliding window structure based on a window size varying with a code rate, while simultaneously reducing a decoding time due to an unnecessary initial delay.

7 Claims, 8 Drawing Sheets

APPARATUS AND METHOD FOR TURBO DECODING USING A VARIABLE WINDOW SIZE

CROSS-REFERENCE TO RELATED APPLICATIONS

This application claims the benefit under 35 U.S.C. §119(a) of Korean Patent Application No. 10-2004-0036742 entitled "Apparatus And Method For Turbo Decoding Using A Variable Window Size" filed in the Korean Intellectual Property Office on May 24, 2004, the entire disclosure of which is incorporated herein by reference.

BACKGROUND OF THE INVENTION

1. Field of the Invention

The present invention relates generally to decoding technology for use in a mobile communication system. More particularly, the present invention relates to a turbo decoder using a variable window size.

2. Description of the Related Art

General digital communication systems widely use forward error correction (FEC) codes to effectively correct an error occurring on a channel at the time of data transmission and improve the reliability of data transmission. These FEC codes commonly include turbo codes. The turbo codes have been adopted by both a synchronous type code division multiple access 2000 (CDMA 2000) system, and an asynchronous type universal mobile telecommunication system (UMTS) serving as third generation (3G) mobile communication systems, because the turbo codes have excellent error correction capabilities at the time of transmitting data at a high rate as compared with convolution codes. Since these two systems can both perform high-speed packet data communication, the performance of a turbo decoder can be improved. The 3G mobile communication systems support various code or coding rates in the turbo decoder.

FIG. 1 is a block diagram illustrating a structure of a conventional turbo decoder.

As illustrated in FIG. 1, the turbo decoder 200 is an example of a constituent decoder designed on the basis of a soft-input soft-output (SISO) scheme. In place of the SISO scheme, the turbo decoder can also be implemented with a maximum a posteriori (MAP) scheme or a register exchange soft output Viterbi algorithm (RESOVA). Here, the SISO scheme computes reliable probability values for symbols, and the RESOVA computes probability values for codewords while regarding a symbol path as a long codeword.

Referring to FIG. 1, a symbol (that is, data bits) stored in a memory buffer 100 is provided to an input terminal of the turbo decoder 200. Deinterleaved bits are classified into a systematic code, and parity-1 and parity-2 codes serving as nonsystematic codes. The systematic code, the parity-1 code, and the parity-2 code, are stored in the memory buffer 100. Systematic code bits and parity code bits are simultaneously output from the memory buffer 100. Because three types of systematic and non-systematic codes are output from the memory buffer 100, codes output from the memory buffer 100 are provided to a multiplexer (MUX) 210 of the turbo decoder 200 through three buses.

The turbo decoder 200 comprises a constituent decoder 220 to which an SISO algorithm is applied (hereinafter, referred to as the "SISO decoder"), an interleaver 230, a deinterleaver 240, an output buffer 250, and a cyclic redundancy code (CRC) checker 260.

The SISO decoder 220 receives the output of the MUX 210, and performs an SISO decoding operation to output a result of the decoding operation as illustrated in FIG. 2. The interleaver 230 interleaves the output of the SISO decoder 220. The deinterleaver 230 de-interleaves the output of the SISO decoder 220. The output buffer 250 stores the output of the deinterleaver 240 such that an L1 layer processor 270 can refer to a result of the deinterleaving. The CRC checker 260 performs a CRC checking operation on the output of the deinterleaver 240, and provides a result of the checking operation to the L1 layer processor 270.

The SISO decoder 220 computes several metrics in the decoding process. That is, while the SISO decoder 220 performs the decoding process, values of a delta metric, alpha ($\alpha$) metric, beta ($\beta$) metric, and log likelihood ratio (LLR) are computed.

The delta metric is a branch metric, and represents a transition probability for a path from a state to another state in a coding trellis structure. The alpha metric is a forward state metric, and represents a cumulative transition probability from a previous state to the present state. The beta metric is a backward state metric, and represents a cumulative transition probability from the next state to the present state. The LLR value is computed from the alpha and beta metrics. The LLR value represents a probability for a symbol, and expresses a ratio of the probability of a '0' value and the probability of a '1' value in a log scale.

Generally, because a frame mode decoder requires alpha and beta metrics to compute an LLR value, the beta metrics are computed after all the alpha metrics are computed, and then LLR values are sequentially computed. Accordingly, while the beta metrics are computed, a delay time occurs.

FIGS. 2A and 2B illustrate a metric computation order in the general SISO decoder. FIG. 2A illustrates a process for computing the alpha metrics, and FIG. 2B illustrates a process for computing the beta metrics.

As illustrated in FIGS. 2A and 2B, it can be found that a difference between an alpha metric computation and a beta metric computation is present. An alpha metric $\alpha_k$ in the k-th state, is computed from a previous alpha metric in the (k−1)-th state. A beta metric $\beta_k$ in the k-th state, is computed from the next beta metric in the (k+1)-th state subsequent to the k-th state. To compute the beta metrics, received signal components must be referred to in a reverse order. Accordingly, an initial delay time corresponding to a total received-signal length occurs.

FIG. 3 illustrates the metric computation order of the conventional turbo decoder based on a frame mode scheme.

Referring to FIG. 3, an initial delay time corresponding to a frame interval occurs because alpha metrics and LLR ($\lambda$) values are computed after all beta metrics of one frame are computed. The SISO decoder based on the frame mode scheme computes the alpha metrics and the LLR values after computing the beta metrics. Accordingly, a delay time occurs during a beta metric computation time. To reduce this initial delay time, a window mode was proposed.

To address the above-described problems, a sliding window mode is applied. In the sliding window mode, two beta metric blocks are used, and successive beta metrics are output.

FIG. 4 illustrates the computation order of the turbo decoder based on the window mode scheme.

Referring to FIG. 4, the SISO decoder based on the window mode scheme divides a signal received for a beta metric computation into a predetermined window size. When beta metrics are computed from the divided received signal, initial computation values are inaccurate, but later computation values are accurate. These accurate computation values are used to compute LLR values. While accurate values are computed with respect to a window, inaccurate values are computed with respect to another window. For convenience of computation, an inaccurate interval and a reliable interval are set to the same size.

A general example of computing an LLR (λ) value associated with a beta metric will now be described in greater detail.

First, a beta metric 1B ($\beta_{1B}$) and a beta metric 1A ($\beta_{1A}$) are computed in a reverse order during a window interval. Immediately after the beta metric 1A ($\beta_{1A}$) is computed, a beta metric 2C ($\beta_{1C}$) and a beta metric 2B ($\beta_{2B}$) are computed in a reverse order. The inaccurate beta metric 1A ($\beta_{1A}$) of the beta metrics 1B ($\beta_{1B}$) and 1A ($\beta_{1A}$) in the initial delay interval is discarded. Immediately after the accurate beta metric 2B ($\beta_{2B}$) is computed, an alpha metric $\alpha_B$ and an LLR $\lambda_B$ are computed simultaneously. A window interval for which $\beta_{1B}$ and $\beta_{1A}$ are computed corresponds to the initial delay time.

As described above, the general SISO decoder uses a fixed sliding window size. In this case, when a code rate is low, no problems are encountered. However, when a code rate is high, decoding performance is degraded.

Specifically, when the conventional turbo decoder computes a beta metric from the last part of a received signal, the reliability of the metric computation becomes high. However, the sliding window scheme divides a total interval into multiple intervals, performs computations on an interval-by-interval basis, discards an unreliable interval, and uses output values subsequent to the discarded interval. When a code rate is high, a long interval is required such that desired reliability can be obtained. In this case, a sliding window size of a relatively long length may be set according to the high code rate. However, when a code rate of received data is low, there is a problem in that an additional initial delay occurs due to the sliding window size of the unnecessarily long length.

Accordingly, a need exists for a system and method to adjust a window size on the basis of a code rate for a turbo decoder using the sliding window.

SUMMARY OF THE INVENTION

Accordingly, the present invention has been designed to solve the above and other problems occurring in the prior art. Therefore, it is an aspect of the present invention to provide an optimized turbo decoder using a window size varying with a code rate.

It is another aspect of the present invention to provide a turbo decoder in which a window size is set to be large when a code rate is high, and is set to be small when a code rate is low.

The above and other aspects of the present invention can be achieved by providing an apparatus for turbo decoding using a variable window size. The apparatus comprises at least one constituent decoder, wherein the constituent decoder comprises control logic for receiving information about a code rate of received data bits and a data block size, adjusting a window size according to the code rate information, and computing an initial delay, and further comprises a plurality of delta metric blocks for computing delta metrics from input data bits of the block size. The delta metrics represent a transition probability for a path from a state to another state, respectively. The apparatus further comprises an alpha metric block for receiving a delta metric in synchronization with the initial delay and computing an alpha metric representing a forward state transition probability in each state, one or more beta metric blocks for receiving delta metrics according to the adjusted window size and computing beta metrics representing a backward state transition probability in each state, respectively, and a log likelihood ratio (LLR) block for receiving the alpha metric and the beta metrics in synchronization with the initial delay and computing LLR values for symbols in an ending state.

The above and other aspects of the present invention can also be achieved by providing a method for turbo decoding using a variable window size. The method includes the steps of receiving information about a code rate of received data bits and a data block size, adjusting a window size according to the code rate information, and computing an initial delay. The method further comprises the steps of computing delta metrics from input data bits of the block size, the delta metrics representing a transition probability for a path from a state to another state, respectively, computing beta metrics representing a backward state transition probability in each state, respectively, by using delta metrics according to the adjusted window size, computing an alpha metric representing a forward state transition probability in each state by using a delta metric, and receiving the alpha metric and the beta metrics and computing log likelihood ratio (LLR) values for symbols in an ending state.

BRIEF DESCRIPTION OF THE DRAWINGS

The above and other aspects and advantages of the present invention will become more clearly understood from the following detailed description taken in conjunction with the accompanying drawings, in which.

DETAILED DESCRIPTION OF THE EXEMPLARY EMBODIMENTS

Figure 1:
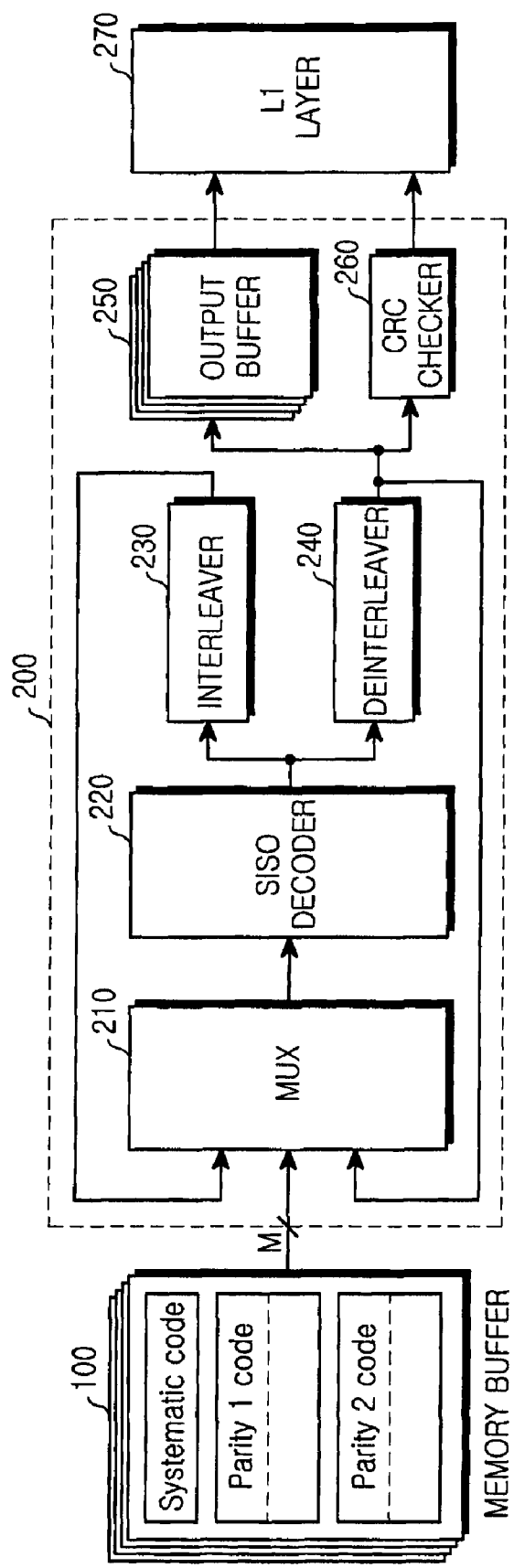
FIG. 1 is a block diagram illustrating a structure of a conventional turbo decoder.
Figure 2A:
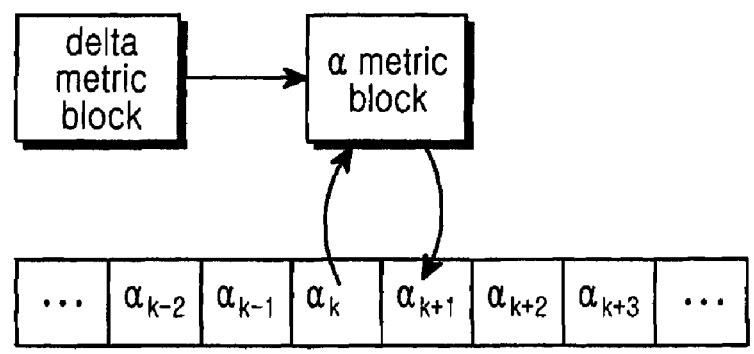
FIG. 2A illustrates an alpha metric computation process of a conventional turbo decoder.
Figure 2B:
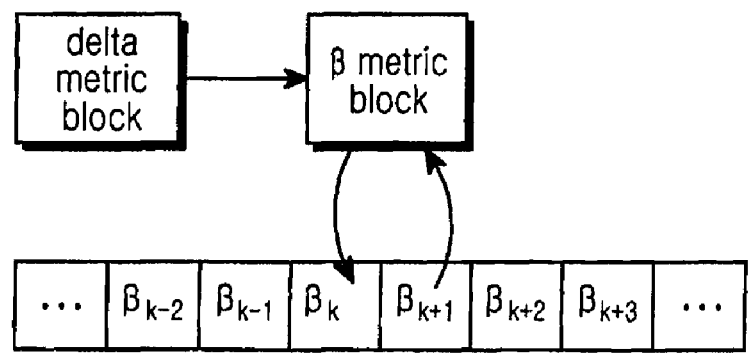
FIG. 2B illustrates a beta metric computation process of a conventional turbo decoder.
Figure 3:
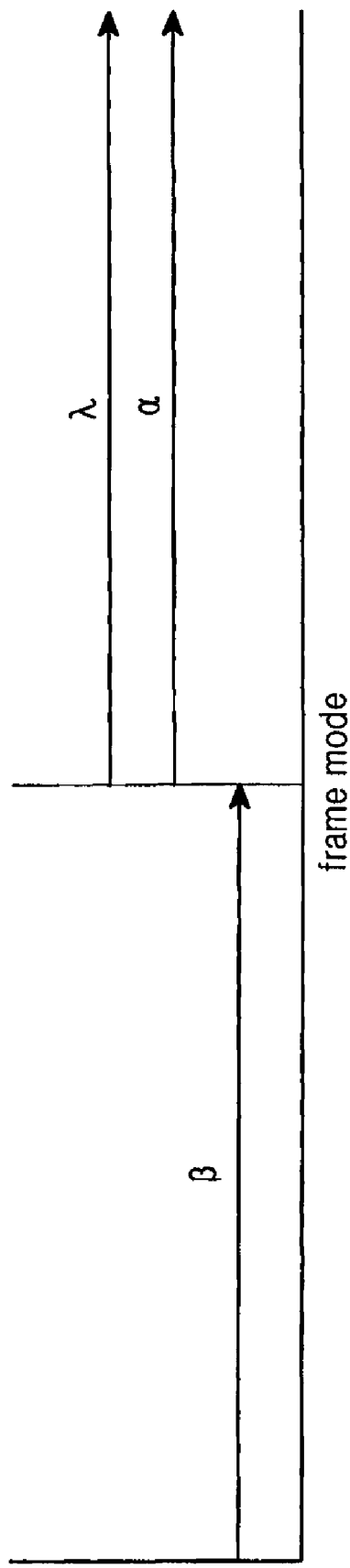
FIG. 3 illustrates metric computation order of the conventional turbo decoder based on a frame mode scheme.
Figure 4:
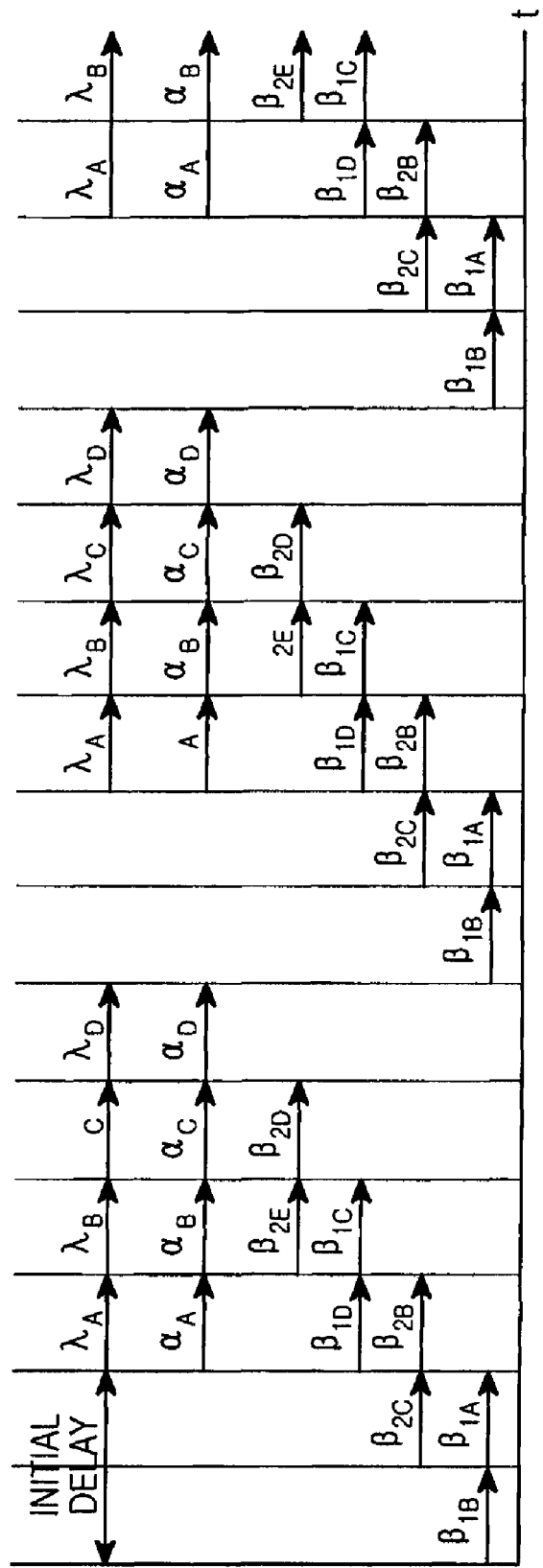
FIG. 4 illustrates metric computation order of the conventional turbo decoder based on a window mode scheme.

A number of exemplary embodiments of the present invention will now be described in greater detail with reference to the accompanying drawings. In the drawings, the same or similar elements are denoted by the same reference numerals, even though they are depicted in different drawings. In the following description made in conjunction with the embodiments of the present invention, a variety of specific elements are shown. The description of such elements has been provided for a better understanding of the present invention. Additionally, in the following description, detailed descriptions of functions and configurations incorporated herein that are well known to those skilled in the art are omitted for clarity and conciseness. It is to be understood that the phraseology and terminology used herein is for the purpose of description and should not be regarded as limiting the present invention.

The present invention provides a turbo decoder for adjusting a window size according to a decoding rate for a beta metric computation.

Before a description of the exemplary embodiments of the present invention is given, a conventional turbo decoder structure and processing flow of alpha and delta metric data in a fixed window size will be described in greater detail.

Figure 5:
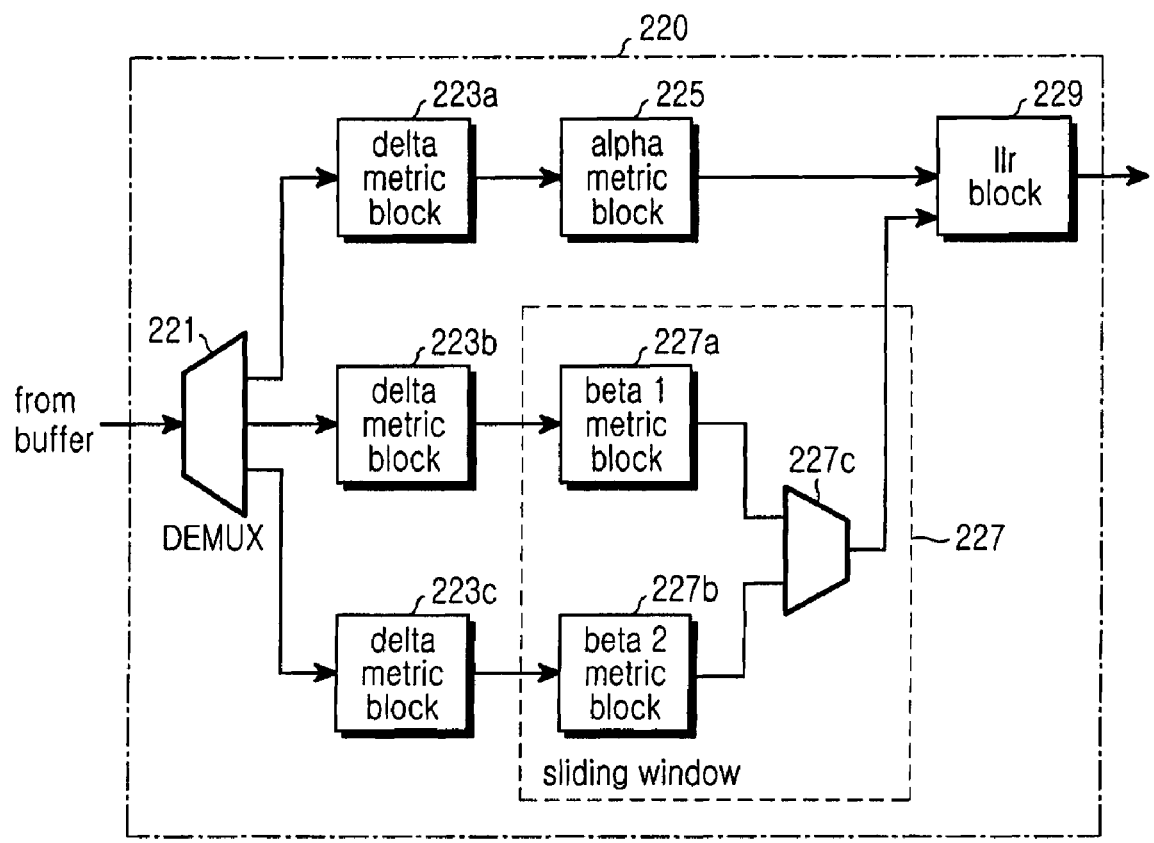
FIG. 5 is a block diagram illustrating a general soft-input soft-output (SISO) decoder based on a sliding window mode scheme.

FIG. 5 is a block diagram illustrating a general soft-input soft-output (SISO) decoder based on a sliding window mode scheme. A beta block includes two beta metric blocks according to the number of windows.

Referring to FIG. 5, a demultiplexer (DEMUX) 221 accesses data bits stored in a memory buffer 100 (illustrated in FIG. 1) at a preset rate, for example, at a rate three times the clock (that is, the operating frequency) of a turbo decoder, and provides first, second, and third outputs. Three delta metric blocks 223a, 223b, and 223c, compute delta metrics from the first, second, and third outputs of the DEMUX 221, respectively. An alpha metric block 225 receives a delta metric computed by the delta metric block 223a, and computes a corresponding alpha metric. A beta block 227 includes the first beta metric block 227a for computing the first beta metric in an accurate interval of a window, the second beta metric block 227b for computing the second beta metric in the remaining interval of the window, and a multiplexer 227c for multiplexing the computation results of the blocks 227a and 227b.

A log likelihood ratio (LLR) block 229 receives the alpha metrics computed by the alpha metric block 225a and multiplexing results of the multiplexer 227c, and computes corresponding LLR values. The LLR block 229 determines symbols on the basis of the LLR values. The symbols determined by the LLR block 229 are output to the interleaver 230 and the deinterleaver 240 of FIG. 1, such that the symbols are interleaved and deinterleaved.

To compute the LLR values, the LLR block 229 computes probabilities for symbols on the basis of forward and backward state transition probabilities. In this case, when the LLR value is positive, a symbol '1' is provided. However, when the LLR value is negative, a symbol '0' is provided.

Figure 6:
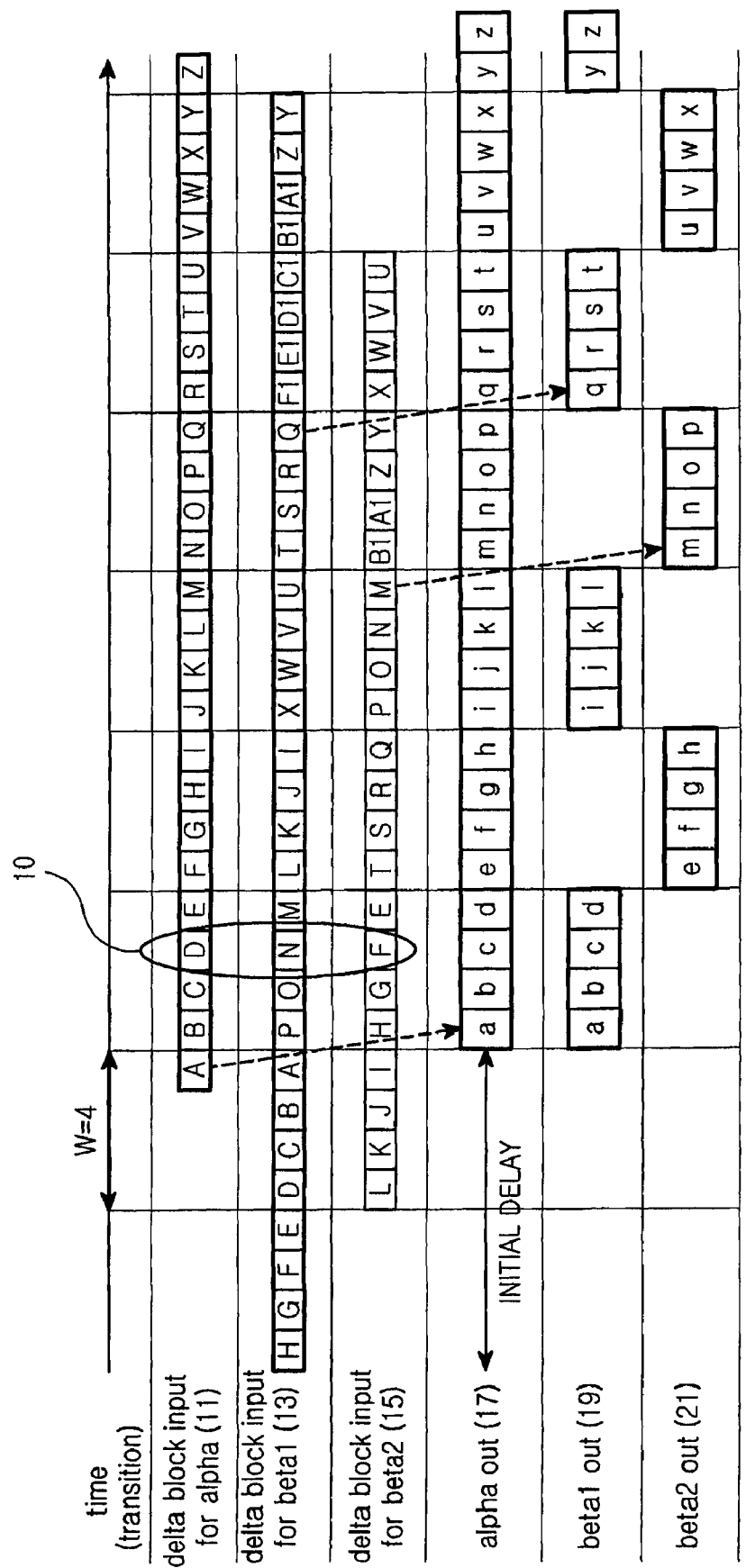
FIG. 6 illustrates a processing flow of a data bit input and a metric output in the general SISO decoder of FIG. 5.

FIG. 6 illustrates a processing flow of a data bit input and a metric output in the general SISO decoder of FIG. 5.

Referring to FIG. 6, data bits of a received signal that are stored in different addresses of the memory buffer illustrated in FIG. 1, are applied to the delta metric blocks 223a, 223b, and 223c, of the SISO decoder. That is, reference numeral 10 denotes data bits D, N, and F, that are read from different addresses of the memory buffer 100 at the same time point.

In FIG. 6, the horizontal axis represents time. As shown in FIG. 6, different data bits are provided to the delta metric blocks 223a, 223b, and 223c, as time elapses. In this case, data bits of a 2W size are provided to the beta metric blocks 227a and 227b in a reverse order. As illustrated in FIG. 6, capital letters written inside the delta metric block inputs 11, 13, and 15, indicate data bit values input to the delta metric blocks 223a, 223b, and 223c. As illustrated in FIG. 6, small letters written inside alpha and beta metric block outputs 17, 19, and 20, indicate metric values output from the alpha metric block 225, and the beta metric blocks 227a and 227b.

The delta metric blocks 223a, 223b, and 223c, read a preset number of data bits, for example, 4 data bits. The beta metric blocks 227a and 227b, compute beta metrics from input signals of a predetermined window size of 2W, and output the beta metrics of a W size computed in an accurate interval.

For synchronization between an alpha metric output and an LLR output, a beta metric is first computed before an alpha metric is computed. That is, the first beta metric block 227a and the second beta metric block 227b, alternately output beta metrics. For example, in a time interval T1, beta metric values are computed from delta metrics H, G, F, E, D, C, B, and A, input from the delta metric block 223b, and accurate beta metric values a, b, c, and d, of the computed beta metric values are output. In a time interval T2, beta metric values are computed from delta metrics L, K, J, I, H, G, F, and E, from the delta metric block 223c, and accurate beta metric values e, f, g, and h, of the computed beta metric values are output. That is, the two beta metric blocks 227a and 227b, alternately operate. Because the outputs of the delta metric blocks 223b and 223c for the first and second beta metrics of the SISO decoder 220 alternate, the beta metrics output from the beta metric blocks 227a, 227b, and 227c, are successive.

When a designated window size is small as compared with a received signal code rate or a received data block size in a turbo decoder in which a window size is fixed, reliability is reduced. Alternatively, when a designated window size is large as compared with a received symbol code rate or a received data block size, an unnecessary delay occurs. Accordingly, an exemplary turbo decoder in accordance with an embodiment of the present invention receives control information including a received signal code rate, received data block size, and like information. Then, the turbo decoder of a variable code rate system sets a window size on the basis of the control information, and decodes a received signal, according to the set window size, in blocks for metric computations.

Figure 7:
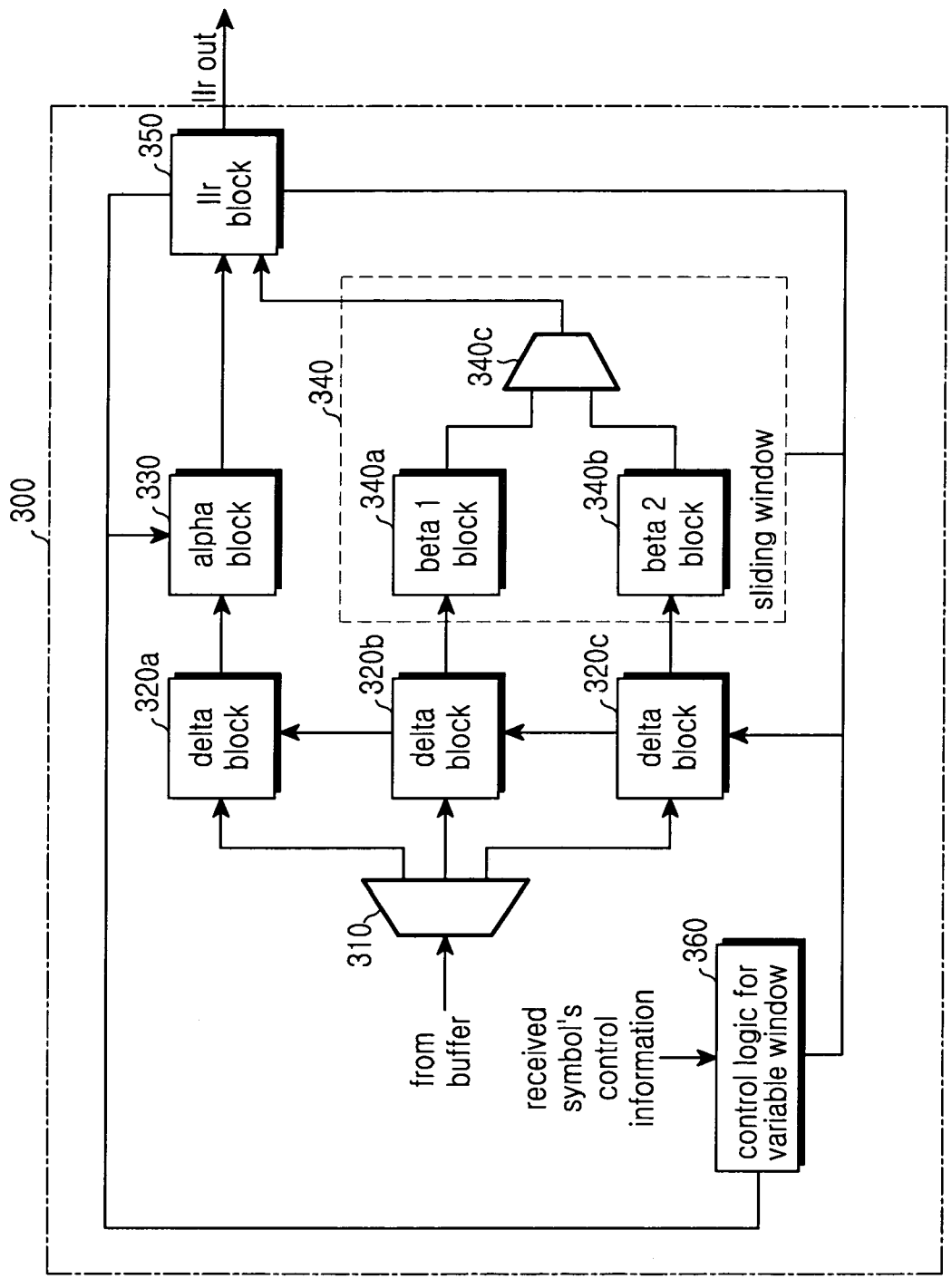
FIG. 7 is a block diagram illustrating an SISO decoder based on a sliding window scheme in accordance with an embodiment of the present invention.

FIG. 7 is a block diagram illustrating an SISO decoder based on a sliding window scheme in accordance with an embodiment of the present invention.

A beta block includes two beta metric blocks according to the number of windows. Referring to FIG. 7, a demultiplexer (DEMUX) 310 accesses data bits stored in a memory buffer 100 at a preset rate, for example, at a rate three times the clock (that is, the operating frequency) of a turbo decoder, and provides first, second, and third outputs.

A control logic block 360 receives control information associated with the received data bits. The control information includes a received data code rate, data block size, and like information. The control logic block 360 analyzes the received control information and determines a window size. The control logic block 360 controls the delta metric blocks 320a, 320b, and 320c, an alpha metric block 330, and beta metric blocks 340a and 340b. That is, the control logic block 360 provides signals indicating an interval of a memory storing data bits to be used to decode data bits in the memory buffer, and an initial delay time for synchronization between an alpha metric and an LLR value, on the basis of the data block size included in the control information. The operation of the control logic block will now be described in greater detail with reference to FIG. 8.

The three delta metric blocks 320a, 320b, and 320c, compute delta metrics from the first, second and third outputs of the DEMUX 310 in response to data bit size information of one block received from the control logic block 360, respectively. The alpha metric block 330 receives a delta metric computed by the delta metric block 320a, and computes an alpha metric on the basis of information about the data block size and the window size received from the control logic block 360. A beta block 340 includes the first beta metric block 340a for computing the first beta metric in an accurate interval on the basis of the window size information received from the control logic block 360, the second beta metric block 340b for computing the second beta metric in the remaining interval, and a multiplexer 340c for multiplexing the computation results of the first and second beta metric blocks 340a and 340b.

An LLR block 350 receives the alpha metrics computed by the alpha metric block 330 and the multiplexed results from the multiplexer 340c, and computes corresponding LLR values on the basis of the information about the data block size and the window size received from the control logic block 360. The LLR block 350 determines symbols on the basis of the LLR values. The symbols determined by the LLR block 350 are output to the interleaver 230 and the deinterleaver 240 of FIG. 1 such that the symbols are interleaved and deinterleaved.

Figure 8:
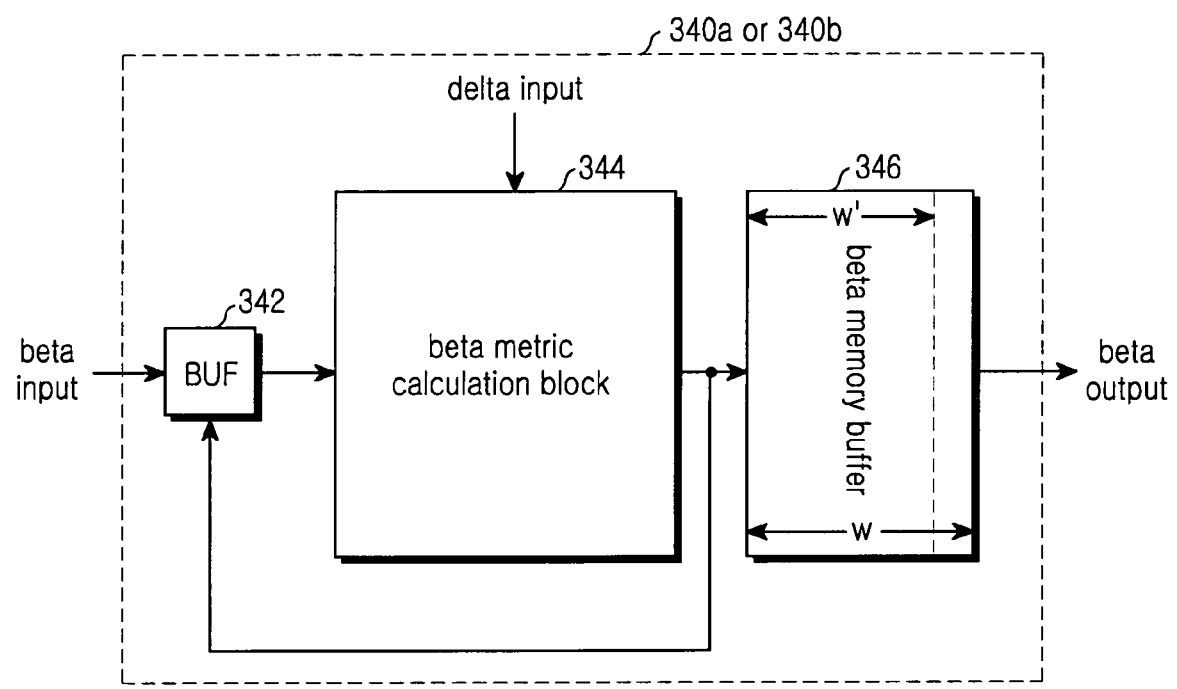
FIG. 8 is a block diagram illustrating details of a beta metric block in accordance with an embodiment of the present invention.

FIG. 8 is a block diagram illustrating details of a beta metric block in accordance with an embodiment of the present invention.

Referring to FIG. 8, the beta metric block 340a and/or 340b includes a memory buffer 342 for storing an initial state value or a beta input value representing the next beta metric, a beta metric calculation block 344 for computing a beta metric in a reverse order using the beta input value and a delta input value, and a beta memory buffer 346 for outputting a beta metric value, computed in the reverse order by the beta metric calculation block 344, in a forward order.

For example, the control logic block 360 receives control information associated with the received data. When the received control information indicates a low data code rate, the control logic block 360 sets the present window size to a relatively small window size 2W' in response to the received code rate information, and sets a size of the memory buffer block 346 to W'. Then, the beta metric calculation block 344 outputs beta metrics of the buffer block size W' using inputs of the window size 2W'.

When the received control information indicates a high data code rate, the control logic block 360 sets the present window size to a relatively high window size 2W in response to the received code rate information, and sets a size of the memory buffer block 346 to W. The memory buffer block 346 stores beta metrics of the buffer block size W. Then, the beta metric calculation block 344 outputs beta metrics of the buffer block size W using inputs of the window size 2W.

As is apparent from the above description, the present invention has a number of advantages.

For example, the present invention can reduce a decoding time due to an unnecessary initial delay while maintaining code reliability by using a sliding window structure based on a window size varying with a code rate.

Moreover, the present invention can improve the performance of a turbo decoder by reducing an initial delay time.

Although exemplary embodiments of the present invention have been disclosed for illustrative purposes, those skilled in the art will appreciate that various modifications, additions, and substitutions are possible, without departing from the scope of the present invention. Therefore, the present invention is not limited to the above-described embodiments, but is defined by the following claims, along with their full scope of equivalents.

What is claimed is:

1. An apparatus for turbo decoding using a variable window size, comprising at least one constituent decoder, the at least one constituent decoder comprising:
    a control logic block for receiving information including a code rate of received data bits and a data block size, adjusting a window size according to the code rate information, and computing an initial delay;
    a plurality of delta metric blocks for computing delta metrics from input data bits of the block size, the delta metrics representing a transition probability for a path from a state to another state, respectively;
    an alpha metric block for receiving a delta metric in synchronization with the initial delay, and computing an alpha metric representing a forward state transition probability in each state;
    one or more beta metric blocks for receiving delta metrics according to the adjusted window size, and computing beta metrics representing a backward state transition probability in each state, respectively; and
    a log likelihood ratio (LLR) block for receiving the alpha metric and the beta metrics in synchronization with the initial delay, and computing LLR values for symbols in an ending state.

2. The apparatus of claim 1, wherein the window size is adjusted in proportion to the code rate.

3. The apparatus of claim 1, wherein the initial delay is used to simultaneously input the beta and alpha metrics to the LLR block.

4. The apparatus of claim 1, wherein each of the one or more beta metric blocks comprises:
    a buffer for storing an initial state value or beta input values representing next beta metric values according to the data block size information received from the control logic block;
    a beta metric calculation block for receiving the beta input values and delta metrics of the window size in a reverse order, and computing beta metric values based on the window size from the beta input values and the delta metrics; and
    a memory buffer for storing the beta metric values output from the beta metric calculation block according to the window size adjusted by the control logic block, and outputting the beta metric values in a forward order.

5. A method for turbo decoding using a variable window size, comprising the steps of:
    receiving information including a code rate of received data bits and a data block size, adjusting a window size according to the code rate information, and computing an initial delay;
    computing delta metrics from input data bits of the block size, the delta metrics representing a transition probability for a path from a state to another state, respectively;
    computing beta metrics representing a backward state transition probability in each state, respectively, by using delta metrics according to the adjusted window size;
    computing an alpha metric representing a forward state transition probability in each state by using a delta metric; and
    receiving the alpha metric and the beta metrics in synchronization with the initial delay, and computing log likelihood ratio (LLR) values for symbols in an ending state.

6. The method of claim 5, wherein the window size is adjusted in proportion to the code rate.

7. The method of claim 5, wherein the step of computing the beta metrics comprises the steps of:
- storing an initial state value or beta input values representing next beta metric values according to the data block size information and computing an initial delay;
- receiving the beta input values and delta metrics of the window size in a reverse order, and computing beta metric values based on the window size from the beta input values and the delta metrics; and
- outputting the computed beta metric values in a forward order.

* * * * *